United States Patent [19]
Kobayashi et al.

[11] Patent Number: 5,640,116
[45] Date of Patent: Jun. 17, 1997

[54] PLL CIRCUIT OF PULSE SWALLOW-TYPE PRESCALER SYSTEM

[75] Inventors: Akira Kobayashi; Shinji Saito, both of Kasugai, Japan

[73] Assignees: Fujitsu Limited, Kawasaki; Fujitsu VLSI Limited, Kasugai, both of Japan

[21] Appl. No.: 481,832

[22] Filed: Jun. 7, 1995

Related U.S. Application Data

[63] Continuation of Ser. No. 359,340, Dec. 19, 1994, abandoned, which is a continuation of Ser. No. 121,497, Sep. 16, 1993, abandoned.

[30] Foreign Application Priority Data

Mar. 18, 1993 [JP] Japan .................................. 5-058937

[51] Int. Cl.$^6$ .................................................. H03H 11/16
[52] U.S. Cl. .............................. 327/231; 331/25; 331/1 A
[58] Field of Search .................................. 307/262, 269; 328/63, 155, 179, 201; 331/25, 1 A; 327/231

[56] References Cited

U.S. PATENT DOCUMENTS 4,414,687 11/1983 Hirata ....................................... 455/165

FOREIGN PATENT DOCUMENTS 57-18129  1/1982  Japan .

Primary Examiner—William L. Sikes
Assistant Examiner—James A. Dudek
Attorney, Agent, or Firm—Staas & Halsey

[57] ABSTRACT

A PLL circuit of the pulse swallow-type prescaler system prevents erroneous module count operations such as are caused by a delay in the module signal, without the need to use a device which operates at high speeds or a device of large power. In a synthesizer of the pulse swallow-type prescaler system, a PLL circuit has a PLL COUNTER circuit and a module pulse generating circuit and a prescaler circuit has a prescaler counter, an extender circuit and a module control circuit which outputs a module control signal MO, for controlling the module operation, upon sensing the logic state of the module pulse generating signal MK, which is output by the module pulse signal generating circuit in response to the output signal MD of the PLL counter circuit.

8 Claims, 8 Drawing Sheets

| M | $Q_3$ |
|---|---|
| H | L |
| L | OPERATION |

$\overline{OUT}$

CONVENTIONAL MK SIGNAL

MK SIGNAL OF THE INVENTION

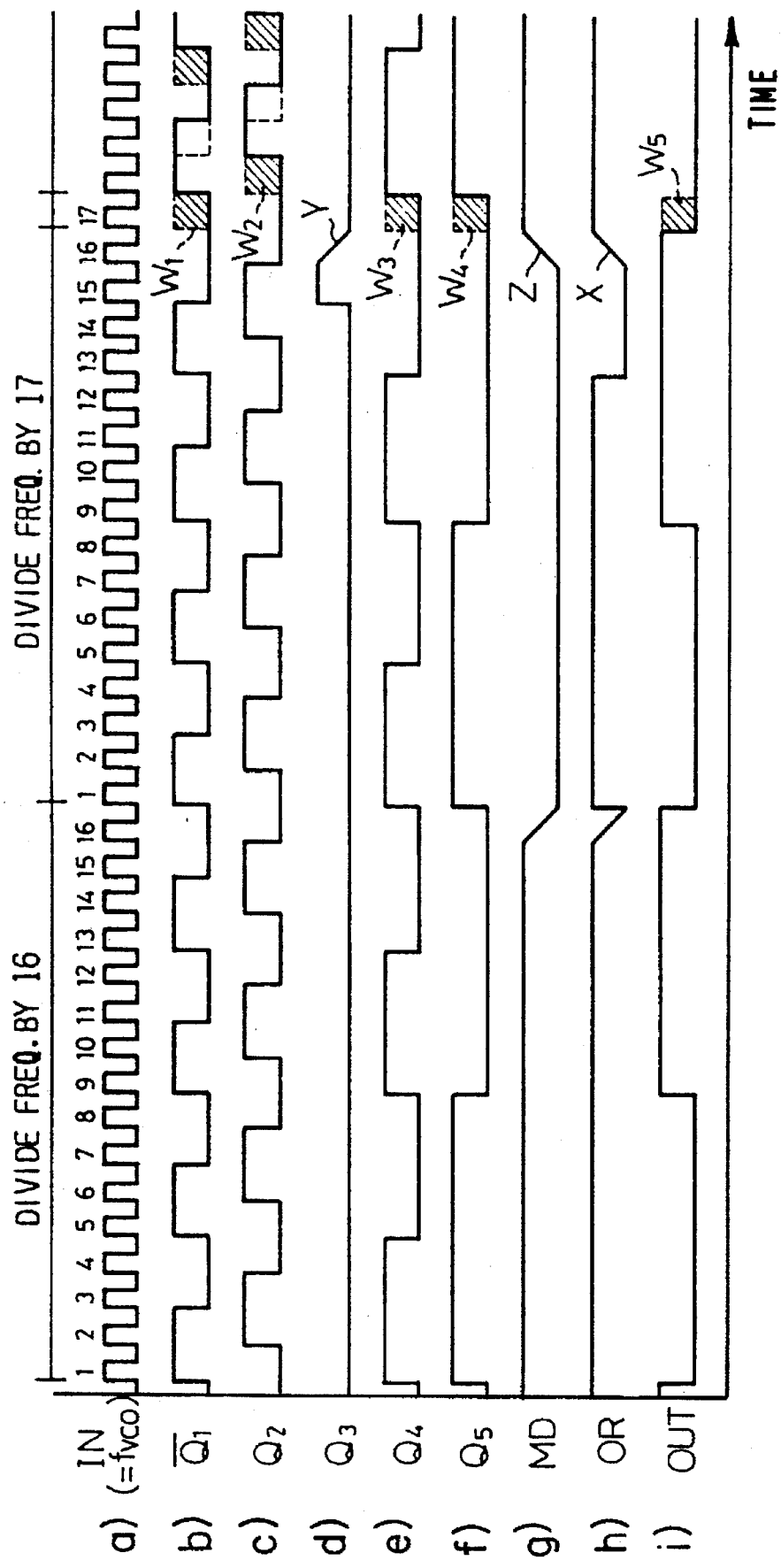

PLL CIRCUIT OF PULSE SWALLOW-TYPE PRESCALER SYSTEM

This application is a continuation of application Ser. No. 08/359,340, filed Dec. 19, 1994, now abandoned which is a continuation of application Ser. No. 08/121,497, filed Sep. 16, 1993, now abandoned.

BACKGROUND OF THE INVENTION

1. Field of the Invention

The present invention relates to a PLL circuit in a PLL synthesizer which utilizes a pulse swallow system. More specifically, the invention relates to a PLL circuit which prevents the module from being erroneously operated in a PLL circuit.

2. Description of the Related Art

A PLL circuit has heretofore been known that carries out the PLL operation by using the pulse swallow-type prescaler system.

In the field of mobile body communications in recent years, there is a trend to expand the frequency band used for such communications, necessitating the employment of high-speed tuning.

In order to realize such high-speed tuning, it becomes necessary to increase a reference frequency resulting, however, in a delay of operation of the PLL circuit and the circuit constituting the periphery thereof and also in the occurrence of error in the PLL operation. It has therefore been urged to solve such problems.

In order to solve the problem of delay, it is necessary to shorten as much as possible the delay time of the elements which comprise the PLL circuit and also the circuits forming the periphery thereof. In the conventional PLL synthesizers of this type, however, the delay time can be shortened by using, for example, a high-speed device or a device of a large power.

In the conventional PLL synthesizers, the delay time in the devices is shortened by using a device that operates at a high speed or by using a device of a large power which has a large size, resulting in an increase in the consumption of electric power and the size of the circuit, causing the cost to be increased. In the modern mobile body communications devices powered by cells, in particular, an increase in the consumption of electric power becomes a fatal defect which makes it difficult to solve the problem from a practical point of view.

In the conventional PLL circuit, therefore, it was not possible to avoid the occurrence of an erroneous operation caused by the delay of a signal MO that controls the module operation when a high frequency is used.

That is, when a PLL circuit for a synthesizer is constituted relying upon the conventional pulse swallow-type prescaler system, there is employed a circuit structure having a block diagram as shown in, for example, FIG. 7.

That is, in the synthesizer of the pulse swallow-type prescaler system which includes a prescaler circuit 1 and a PLL circuit 2, the PLL circuit is provided with a PLL COUNTER CIRCUIT 7, and the prescaler circuit 1 is provided with a counter 3 that performs module operation, an extender circuit 4 and an OR gate circuit 6 which generates a module control signal MO to control the module operation of the counter unit 3.

That is, in the above-mentioned conventional PLL circuit, the OR gate circuit 6 finds an OR logic based on a module pulse signal (b) from the PLL COUNTER circuit 7 and an internal clock signal (f) from the extender circuit 4, and outputs a module control signal MO to control the module operation of the counter 3. However, when a delay exists between the module pulse signal (b) and the internal clock signal (f) from the extender circuit 4, an erroneous operation takes place temporarily in the generation of the module control signal MO. Therefore, the module does not properly operate in the counting unit, and a predetermined frequency-dividing operation is not executed.

One of the causes of the generation of such an erroneous operation is attributed to the fact that in finding an OR logic based on the module pulse signal (b) from the PLL COUNTER circuit 7 and the internal clock signal (f) from the extender circuit 4, the logic is determined by detecting the rising edge or the falling edge of the module pulse signal (b). Therefore, when the waveform of the pulse signal that is rising or falling is deformed, or when the rising or falling timing of the pulse is deviated due to the delay, the module control signal MO is not properly generated and an error develops in the module operation.

The above condition will now be described with reference to FIGS. 8 and 9.

FIG. 8 illustrates the concrete circuit structure of the counter 3 and the extender circuit 4 of the prescaler circuit 1 in the conventional PLL circuit, and wherein the counter 3 is comprised of flip-flops FF1 to FF3 of the edge trigger type and OR gates 9 and 10, and wherein the flip-flop FF3 has a reset terminal M.

The extender circuit 4 is comprised of, for example, T-type flip-flops T-FF4 and T-FF5, and a frequency-dividing ratio is determined by the number of stages of the T-type flip-flops T-FF.

The output of the extender circuit 4, i.e., the Q-output (a) of the T-type flip-flop T-FF5, is output, for example, to the PLL circuit 2 (FIG. 7) via an inverter 11 to drive the PLL COUNTER circuit 7.

The module pulse signal MD output from the PLL circuit 2 and the Q-outputs from the T-type flip-flops T-FF4 and T-FF5 of the extender circuit 4 are input to the OR gate 12, and an output of "L" level is produced from the OR gate 12 when the inputs are all of the "L" level. The output of the "L" level is input to the reset terminal M of the flip-flop FF3 in the counter 3. Therefore, an output of the "H" level, from the Q-terminal of the flip-flop FF3, is input to the D-terminal of the flip-flop FF1 via the OR gate 9 in the counter unit 3. Accordingly, the Q-bar output of the flip-flop FF1 changes, by being deviated by one pulse, with respect to the input clock signal. Therefore, the counter 3 executes a module operation in which a frequency-dividing ratio P+1 is selected with respect to a predetermined frequency-dividing ratio P.

FIG. 9 is a diagram of waveforms illustrating the driving conditions of the devices of a PLL circuit having the circuit structure shown in FIG. 8, and illustrates the case where the module operations of dividing the frequency by 16 (P) and dividing the frequency by 17 (P+1) are alternately repeated in the prescaler circuit at the input frequency $f_{vco}$.

In the PLL circuit of the pulse swallow-type prescaler system, as in the present invention, a value obtained by dividing a quartz oscillation frequency $f_{osc}$ by a frequency-dividing ratio R of a reference counter is used as a reference frequency fr (fr=$f_{osc}$÷R) and an oscillation frequency of a VCO oscillator provided in the PLL circuit is denoted as $f_{vco}$. Then, a comparison frequency fp to be compared with the reference frequency fr is expressed as fp=$f_{vco}$÷(P×N+A). In the prescaler circuit, the VCO oscillation frequency $f_{vco}$ is used as an input frequency.

Here, P denotes the frequency-dividing ratio of the prescaler, N denotes the frequency-dividing ratio of a comparator counter which is a main counter in the PLL circuit, and A denotes the frequency-dividing ratio of the pulse swallow counter.

When the PLL loop is locked, fr=fp from the characteristics of the PLL circuit, and a relationship $f_{osc} \div R = f_{vco} \div (P \times N + A)$ holds.

When the reference frequency is increased in order to accomplish high-speed tuning, as mentioned earlier, the frequency-dividing ratio R of the reference counter becomes small and it inevitably becomes necessary to decrease the relationship P×N+A.

However, conditions P<N and A<N exist. Therefore, P must be decreased if it is attempted to decrease N.

When the frequency-dividing ratio of the prescaler is decreased under such circumstances, the frequency input to the comparator counter, which is the main counter, becomes very great and, as a result, the operation processing time in the comparator counter is not sufficient to match the processing time in the prescaler circuit unit. Therefore, the module pulse signal MD output from the PLL circuit unit is delayed, causing the module to erroneously operate in the counting unit. For instance, the frequency is divided by 16 though the frequency should have been divided by 17. Accordingly, the predetermined frequency-dividing ratio is not correctly obtained.

Such a condition will now be described with reference to the waveform diagram of FIG. 9. A pulse signal IN (or IN-bar) having an input frequency $f_{vco}$ is input to a corresponding input of the OR gate 10 of the counter 3, a signal that turns "H" and "L" after every two input pulse signals IN or IN-bar is output from the Q-bar terminal of the flip-flop FF1 of the counter unit 3, and a pulse signal that turns "H" and "L" at the same timing but delayed by one pulse behind the Q-bar output of the flip-flop FF1 is output from the Q-terminal of the flip-flop FF2 of the counter 3.

The flip-flop FF3 of the counter 3 is usually maintained in a reset condition. Therefore, a signal Q3 of "L" level is usually output from the Q-terminal of the flip-flop FF3 and is input to the D-terminal of the flip-flop FF1 together with the output Q2 from the Q-terminal of the flip-flop FF2 via the OR gate 9.

The flip-flop FF3 is released from the reset condition as the module control signal MO of "L" level output from the OR gate 12 is input to the reset terminal M of the flip-flop FF3 as will be described later.

In the extender circuit 4, furthermore, a signal Q1-bar output from the Q-bar terminal of the flip-flop FF1 of the counter 3 is input to a clock terminal C of the T-type flip-flop T-FF4, a pulse signal Q4 of a period twice as great as the frequency of the Q1-bar signal is output from the Q-output terminal thereof and is input to a clock terminal C of the neighboring T-type flip-flop T-FF5, and a pulse signal Q5 of a period twice as great as the frequency of the signal Q4 is output from the Q-output terminal of T-FF5 and is input as an output OUT of the extender unit 4 to the PLL circuit element 7 of the PLL circuit 2 via the inverter 11.

The D-input terminal and the Q-bar output terminal of each of the T-type flip-flops T-FF4 and T-FF5 are connected together.

Therefore, the period of the signal OUT output from the extender circuit 4 represents the period derived by dividing the frequency by 16 in the prescaler circuit 1.

Under such a condition, while an output signal pulse, representing a period derived by dividing the frequency by 16 and output by the prescaler circuit 1, is input to the PLL COUNTER circuit 7, a module pulse signal MD, having a logic level that instructs the division of frequency by 16, is output from the PLL COUNTER circuit 7—i.e., the signal MD of "H" level is output from the PLL COUNTER circuit 7. Here, however, a module pulse signal MD, having a logic level that instructs the division of frequency by 17, is output—e.g., the signal MD of "L" level is output—at the moment when the period of the output signal pulse, instructing the period derived by dividing the frequency by 16 output by the prescaler circuit unit 1, is terminated.

A module control signal MO is maintained usually at the "H" level. During this period, the flip-flop FF3 is maintained reset, and then a module control signal of "L" level is output from the OR gate 12 at the moment when the signals input to the OR gate 12 all assume the "L" level. The module control signal of "L" level is then input to the reset terminal M of the flip-flop FF3, whereby the flip-flop FF3 is released from the reset condition, and a signal Q3 of the "H" level is output from the Q-terminal of the flip-flop FF3.

According to the above-described prior art, when the output of the module pulse signal MD changes at a delayed timing or when the waveform of edge of the module pulse signal MD mildly changes as designated at (Z), the timing at which the control signal MO for controlling the modulating operation of the counter 3 is output, is overlapped with the timing at which the data input to all of the input terminals of the OR gate circuit re changed to "L" level.

In this case, however, the waveform of the output signal of the module controlling signal is disturbed (X) and accordingly, it adversely affects the waveform of the output signal Q3 output from the Q-terminal of the flip-flop FF3, and having "H" level signal to make it difficult to form a proper pulse waveform as designated at (Y).

When such a condition develops, the signal output from the Q-bar terminal of the flip-flop FF1 is continuously output, maintaining the "L" level for one more additional reference pulse that is input due to the signal Q3 of "H" level output from the Q-terminal of the flip-flop FF3, and the frequency is divided by 17. Under the above-mentioned condition, however, a pulse of the correct "H" level is not input to the D-terminal of the flip-flop FF1. Accordingly, division of the frequency by 17 is not executed at pulse positions designated at W1 to W5 in FIG. 9. That is, division of the frequency by only 16 is executed despite the module operation being carried out. Accordingly, the desired division of the frequency by 16 and division of the frequency by 17 are not alternately executed during the module operation, and division by 16 only is repetitively executed.

SUMMARY OF THE INVENTION

The object of the present invention is to solve the above-mentioned problems inherent in the prior art by providing a PLL circuit of the pulse swallow-type prescaler system which is capable of preventing erroneous operation caused by a delay in the module signal without the need of a device which operates at high speeds or a large power device.

In order to achieve the above object, the present invention employs the technical structure described below. That is, in a synthesizer of the pulse swallow-type prescaler system including a prescaler circuit unit and a PLL circuit unit, a PLL circuit which comprises a PLL COUNTER unit and a module pulse generating circuit unit, wherein the prescaler circuit unit is provided with a counter unit which performs module operation, an extender unit and a module control circuit unit, and a module control signal that controls the module operation of the counter unit is output from the module control circuit unit in synchronism with an internal clock signal of the prescaler circuit unit upon sensing the logic state of a module pulse output from the module pulse generating circuit unit in response to the output of the PLL unit. In the PLL circuit according to the present invention, a module pulse signal generated from the PLL circuit unit in the conventional PLL COUNTER circuit is so formed as to have pulses corresponding to the number of times the module operation is executed in the prescaler circuit unit to obtain a predetermined frequency-dividing ratio, and a logic of the module pulse signal having such predetermined pulses and of an internal clock signal formed in the prescaler circuit is discriminated in order to feed a module control signal to the counter unit, that constitutes the prescaler circuit unit, to execute the module operation. Unlike the conventional method of generating module control signals, therefore, the module control signal is not generated in response to the timing of a change in the module pulse signal or to a change in the internal clock signal formed in the prescaler circuit unit. Therefore, the problem of erroneous operation caused by a delay of the module control signal even when the INPUT frequency is increased or no matter what frequency-dividing ratio is employed, does not occur.

BRIEF DESCRIPTION OF THE DRAWINGS

FIG. 9 is a diagram of waveforms for explaining the operation of the conventional PLL circuit.

DETAILED DESCRIPTION OF THE PREFERRED EMBODIMENTS

An embodiment of the PLL circuit according to the present invention will now be described in detail with reference to the drawings.

Figure 1:
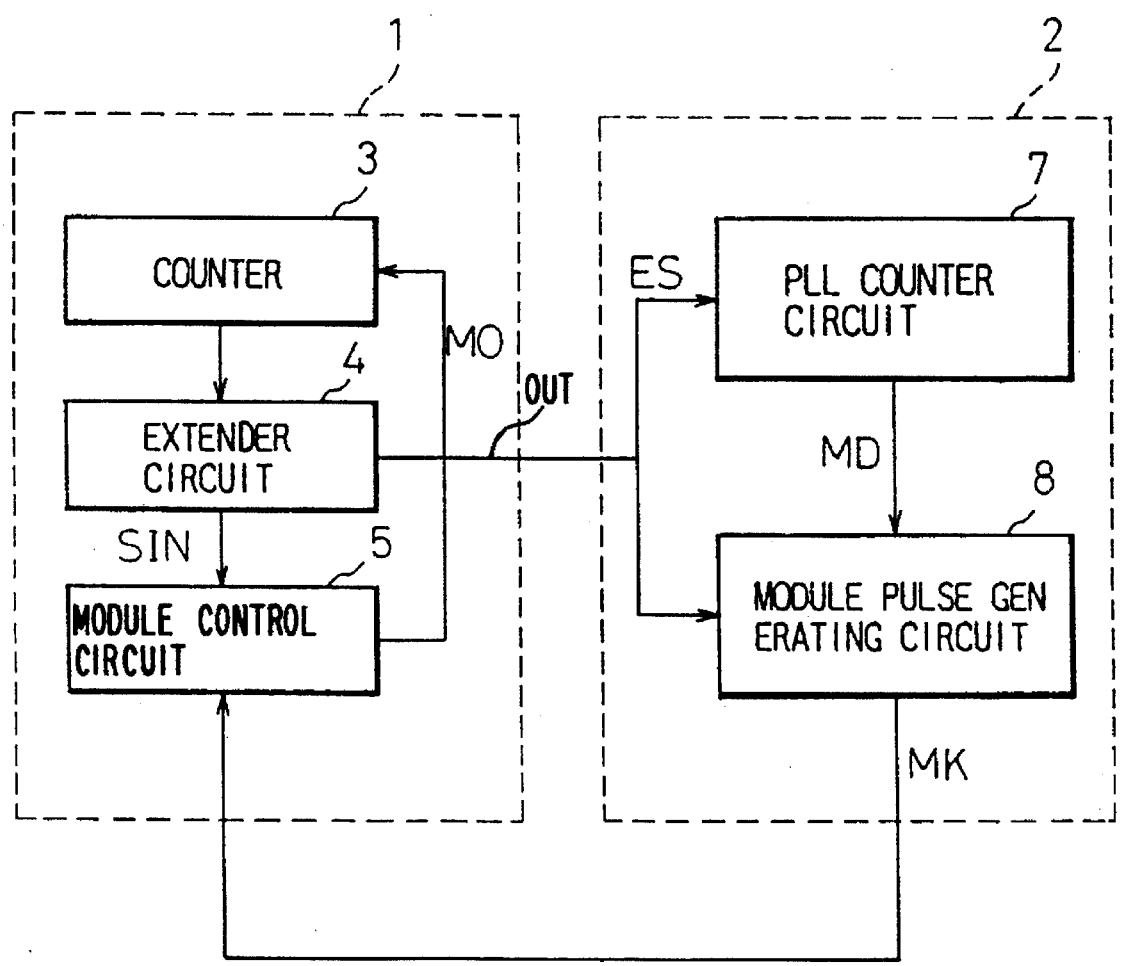
FIG. 1 is a block diagram which schematically illustrates the structure of a PLL circuit according to the present invention.

FIG. 1 is a block diagram illustrating the structure of a PLL circuit for a synthesizer of the pulse swallow-type prescaler system according to an embodiment of the present invention. That is, in a synthesizer of the pulse swallow-type prescaler system including a prescaler circuit 1 and a PLL circuit 2, the PLL circuit 2 comprises a PLL COUNTER circuit 7 and a module pulse signal generating circuit 8. The prescaler circuit 1 is provided with a counter 3 which performs module operation, an extender circuit 4 and a module control circuit 5, and a module control signal MO that controls the module operation of the counter 3 is output from the module control circuit 5 in synchronism with an internal clock signal of the prescaler circuit 1 upon sensing the logic state of the module pulse generating signal MK, as output from the module pulse signal generating circuit 8 in response to the output of the PLL COUNTER circuit 7.

That is, in the conventional PLL circuit as described above, the module pulse generating signal MK, which is an external signal as viewed from the prescaler circuit unit 1, is fixed to the same logic level during the period of module operation of the prescaler circuit unit 1, and a change in the waveform of the module pulse generating signal MK is detected and a logic of this change and an internal signal of the prescaler circuit unit 1 is found to generate a predetermined module control signal MO. Therefore, the delay time in the generation of the signal MK becomes a cause of erroneous operation of the counter unit 3 in the prescaler circuit 1 in the PLL circuit. In the PLL circuit of the present invention, on the other hand, the module pulse generating signal MK, which is the external signal, is so formed as to have a number of pulses that corresponds to the number of times of module operation to be executed in the prescaler circuit unit 1 during the period of a predetermined frequency-dividing operation in the PLL circuit and, at the same time, the logic condition of the module pulse generating signal MK is sensed and a predetermined logic is obtained from the logic state of the module pulse generating signal MK and the logic state of an internal clock signal in the prescaler circuit 1, in order to output a module control signal MO that controls the module operation of the counter 3. Therefore, the module operation never becomes erroneous in the counter 3 even when the module pulse generating signal MK is generated at a delayed timing from the module pulse signal generating circuit 8 in response to the signal MD from the PLL COUNTER circuit 7 in the PLL circuit 2 or even when the waveform of the module pulse generating signal MK is deformed.

More concretely, in the PLL circuit of the present invention, which is basically structured as described above, the PLL COUNTER circuit 7 in the PLL circuit 2 outputs to the module pulse signal generating circuit 8 a signal MD that switches the module operation of the prescaler circuit 1 in response to a preset count value A, the module pulse signal generating circuit 8 outputs, within a predetermined period of time, module pulses of a number corresponding to the number A of module operations executed within the above preset count value in response to the module operation switching signal MD from the PLL COUNTER circuit 7, the module control circuit 5 in the prescaler circuit 1 senses the logic condition of the module pulses output from the module pulse signal generating circuit 8 and finds a predetermined logic from a logic level of the module pulse generating signal MK and a logic level of the internal clock signal SIN, in synchronism with an internal clock signal SIN output from at least either the counter 3 or the extender circuit 4 provided in the prescaler circuit 1, and outputs a predetermined module control signal MO. The counter 3 executes the counting operation by selectively using either a predetermined frequency-dividing ratio P or a frequency-dividing ratio P+1, which is obtained by adding +1 to the predetermined frequency-dividing ratio, in response to the module control signal MO.

Figures 2A, 2B:
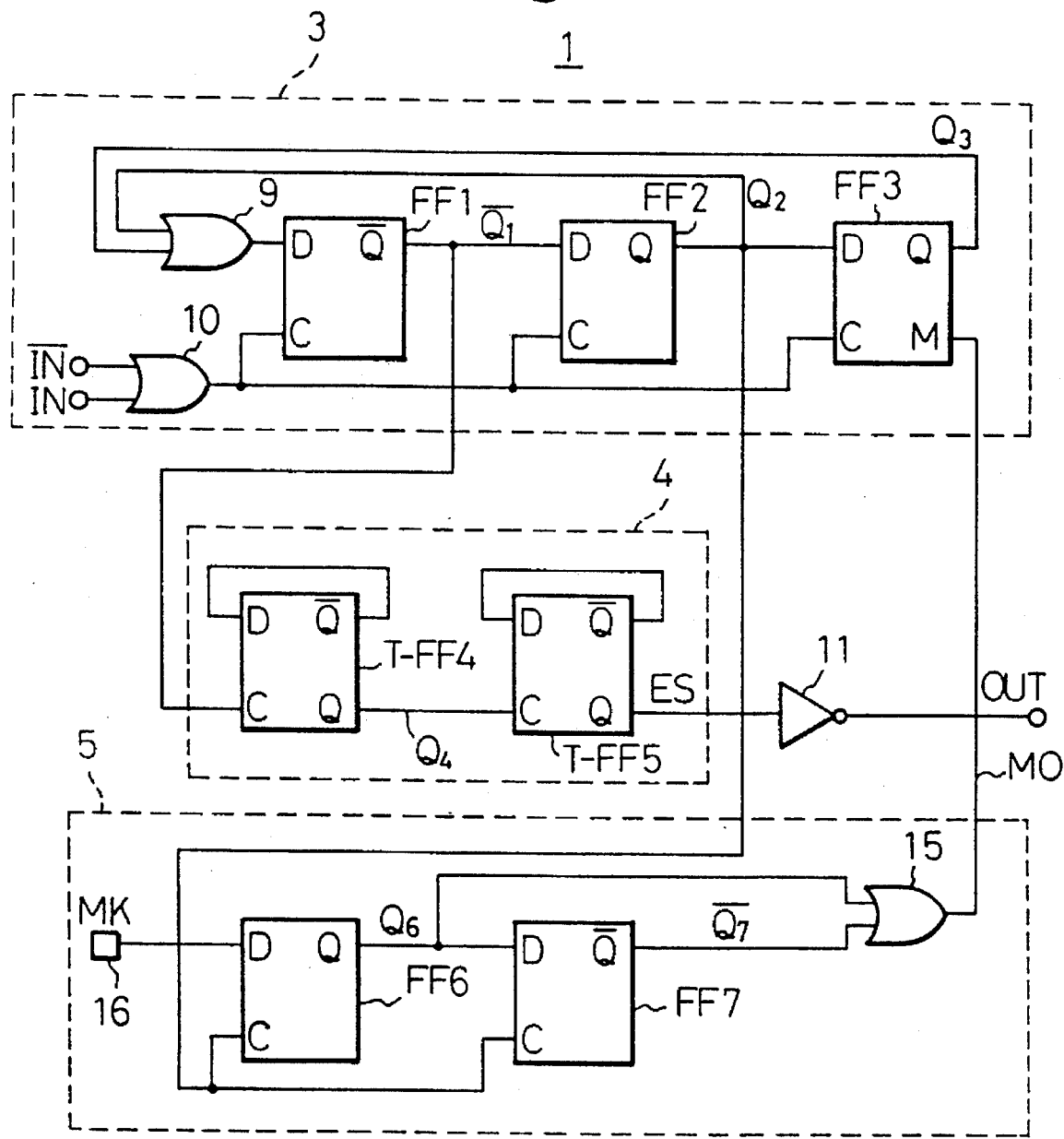
FIGS. 2(A) and 2(B) are block diagrams which illustrates a circuit structure in a prescaler in the PLL circuit of the present invention.

FIG. 2(A) is a block diagram illustrating the structure of the prescaler circuit 1 in the PLL circuit according to the present invention, and wherein the counter 3 is comprised of, for example, flip-flops FF1 to FF3 of the edge trigger type, an OR gate 9 and an input OR gate 10, the flip-flop FF3 having a reset terminal M.

The flip-flop FF3 of the counter 3 is usually maintained in a reset state and, hence, usually outputs a signal Q3 of "L" level from the Q-terminal thereof. The signal Q3 is input to a D-terminal of the flip-flop FF1, together with an output Q2 from the Q-terminal of the flip-flop FF2, via the OR gate 9.

The flip-flop FF3 is released from the reset state when a module control signal MO of "L" level, output from the OR gate 15, is input to the reset terminal M of the flip-flop FF3, as will be described later.

In the counter 3 according to the present invention, furthermore, a pulse signal having an INPUT frequency input to the input OR gate 10 thereof is simultaneously input to clock terminals C of the flip-flops FF1 to FF3, and a Q-bar terminal of the flip-flop FF1 is connected to a D-input terminal of the flip-flop FF2, and a Q-terminal of the flip-flop FF2 is connected to a D-input terminal of the flip-flop FF3.

Next, the extender circuit 4 in the prescaler circuit 1 of the present invention is comprised of, for example, T-type flip-flops T-FF4 to T-FF5, and the frequency-dividing ratio is determined by the number of stages of the T-type flip-flops T-FF.

The output from the extender circuit 4, i.e., a signal ES output from the Q-output of the T-type flip-flop T-FF5, is output, for example, to the PLL circuit 2 via the inverter 11 to drive the PLL COUNTER circuit 7.

The T-type flip-flops T-FF4 and T-FF5 each have D-input terminals and Q-bar terminals that are connected together.

In the extender circuit 4 according to the present invention, the output from the Q-bar terminal of the flip-flop FF1 is fed to the clock terminal C of the T-type flip-flop T-FF4, the Q-output of the T-type flip-flop T-FF4 is fed to the clock input terminal C of T-FF5, and the Q-output of the T-type flip-flop T-FF5 is fed as a control signal ES to, for example, the PLL circuit 2 via the inverter 11 to drive the PLL COUNTER circuit 7.

The module control circuit 5 according to the present invention is comprised of flip-flops FF6 and FF7 of the edge trigger type, an OR gate 15 and an input 16 that receives a module pulse generating signal MK from the module pulse signal generating circuit 8.

In the module control circuit 5 of the present invention, the module pulse generating signal MK output from the module pulse signal generating circuit 8 in the PLL circuit 2 is input to a D-terminal of the flip-flop FF6 via a suitable input 16, a Q-terminal of the flip-flop FF6 is connected to a D-input terminal of the flip-flop FF7 and to one input of the OR gate 15, and a Q-bar terminal of the flip-flop FF7 is connected to the other input terminal of the OR gate circuit 15.

To the clock terminals C of the flip-flops FF6 and FF7 is input a signal output from the Q-terminal of the flip-flop FF2 in the counter 3. Therefore, the module control circuit 5 is driven by a clock signal which is an internal signal formed by the flip-flop FF2 in the counter unit 3.

That is, in the module control circuit 5 according to the present invention, the flip-flop FF6 senses the module pulse generating signal MK output from the module pulse signal generating circuit 8 in response to the output of the PLL COUNTER circuit 7 and detects its logic state and, at the same time, the output logic of the module pulse generating signal MK is shifted by the two flip-flops FF6 and FF7 using the output signal from the Q-terminal of the flip-flop FF2 as a clock signal. When the logic levels of the signals input to the OR gate circuit 15 are both at "L" level, the OR gate 15 outputs a module control signal MO of "L" level which is then input to the reset terminal M of the flip-flop FF3 in the counter 3. Therefore, the flip-flop FF3 is released from the reset state, and a signal of "H" level is output from the Q-terminal of the flip-flop FF3. Based upon the same principle as that of the conventional PLL circuit, therefore, the prescaler circuit 1 executes the module operation to effect the +1 frequency-division.

That is, in the PLL circuit of the present invention, the module pulse signal generating circuit 8 produces a module pulse generating signal MK by generating pulses of a number (A) that corresponds to the count value (e.g., A) of the pulse swallow counter in response to the control signal (i.e., the module operation switching signal) MD from the PLL circuit 2, and the module control circuit 5 generates its own module control signal MO that is not affected by the external signals using the output signal of the counter 3 as a clock, thereby to control the module operation. Therefore, the module operation is controlled without being at all affected by the delay in the control signal MD, the module pulse generating signal MK or the module control signal MO or by deformation of the pulse waveform, thus eliminating the occurrence of erroneous operation that developed in the prior art.

Figure 3:
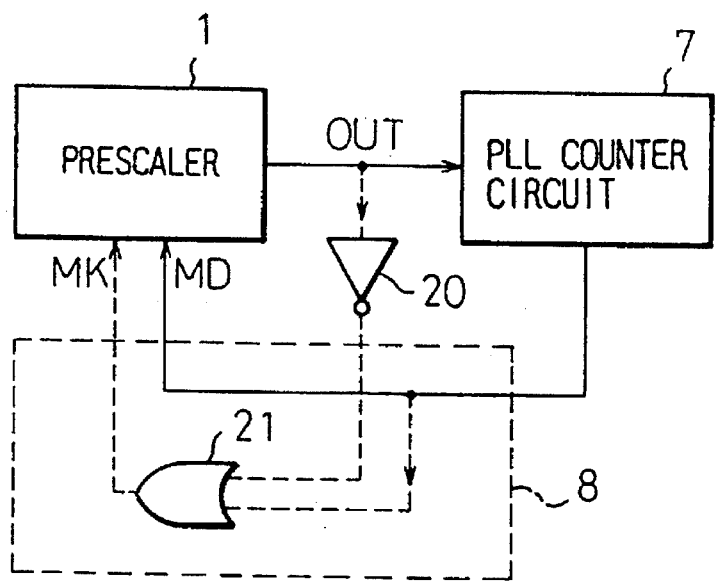
FIG. 3 is a block diagram which illustrates the structure of a module pulse generating circuit in a PLL unit in the PLL circuit according to the present invention.
Figure 4A:
FIGS. 4(A) and 4(B) are diagrams illustrating a difference between a module control signal according to the present invention and a conventional module control signal.
Figure 4B:
Figure 4C:
Figure 5A:
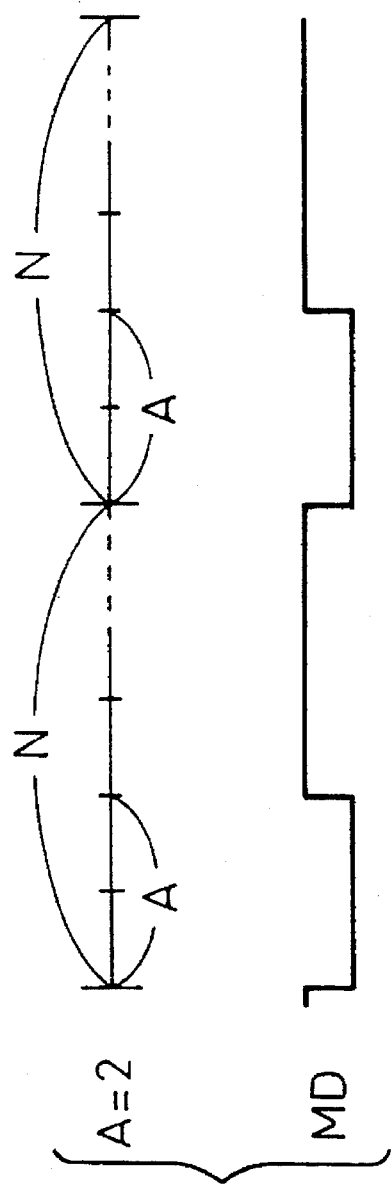
FIGS. 5(A) and 5(B) are diagrams illustrating a difference between the module control signal according to the present invention and the conventional module control signal.
Figure 5B:
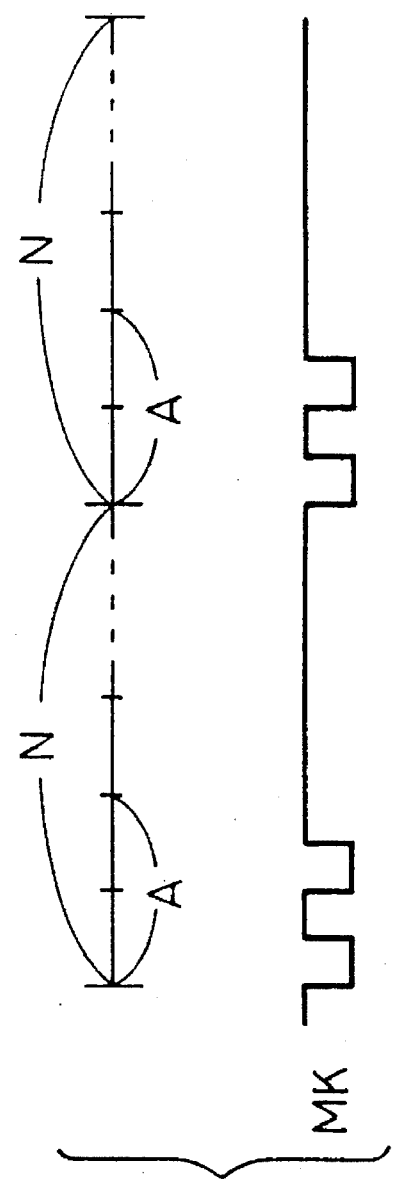

FIG. 3 is a block diagram illustrating the structure of a module pulse generating circuit unit 8 in the PLL circuit of the present invention. Concretely speaking, the module pulse signal generating circuit 8 is comprised of an OR gate 21 which receives an output of the PLL COUNTER circuit 7 through an input terminal thereof and further receives an output OUT of the prescaler circuit 1 through the other input terminal thereof via an inverter 20, and wherein the output of the OR gate 21 is fed to the prescaler circuit unit 1. More concretely, the output of the OR gate 21, i.e., the module pulse generating signal MK, is input to the input 16 (FIG. 2(A)) of the module control circuit 5 of the prescaler circuit unit 1, as mentioned earlier.

In FIG. 3, dotted lines (other than box 8) represent control wiring according to the present invention and solid lines represent conventional control wiring.

FIGS. 4(A) to 5(B) are diagrams of waveforms illustrating the difference between the module pulse generating signal MK according to the present invention and the conventional module pulse generating signal MK. In the conventional module pulse generating signal MK, as shown in a waveform diagram of FIG. 4(B), the time width during the so-called A-count for counting a predetermined frequency-dividing ratio is specified by the width of a pulse that has, for example, the "L" logic level (see FIGS. 5(A) and 5(B)) such that the pulse swallow counter executes a predetermined module operation. In the module pulse generating signal MK of the present invention, as shown in the waveform diagram of FIG. 4(C), on the other hand, pulses are generated in the same number as the A-count number (see FIG. 5(B)) in synchronism with the "L" level of output signals OUT from the prescaler circuit unit 1, as shown in the waveform diagram (A), during the time width of the so-called A-count such that the pulse swallow counter executes a predetermined module operation. In the module pulse generating signal MK of the present invention, pulses of a one-half period of the output of the prescaler circuit unit 1 are generated in a number equal to the A-count number.

The operation of the PLL circuit according to the present invention will now be described in detail with reference to FIG. 6.

Figure 6:
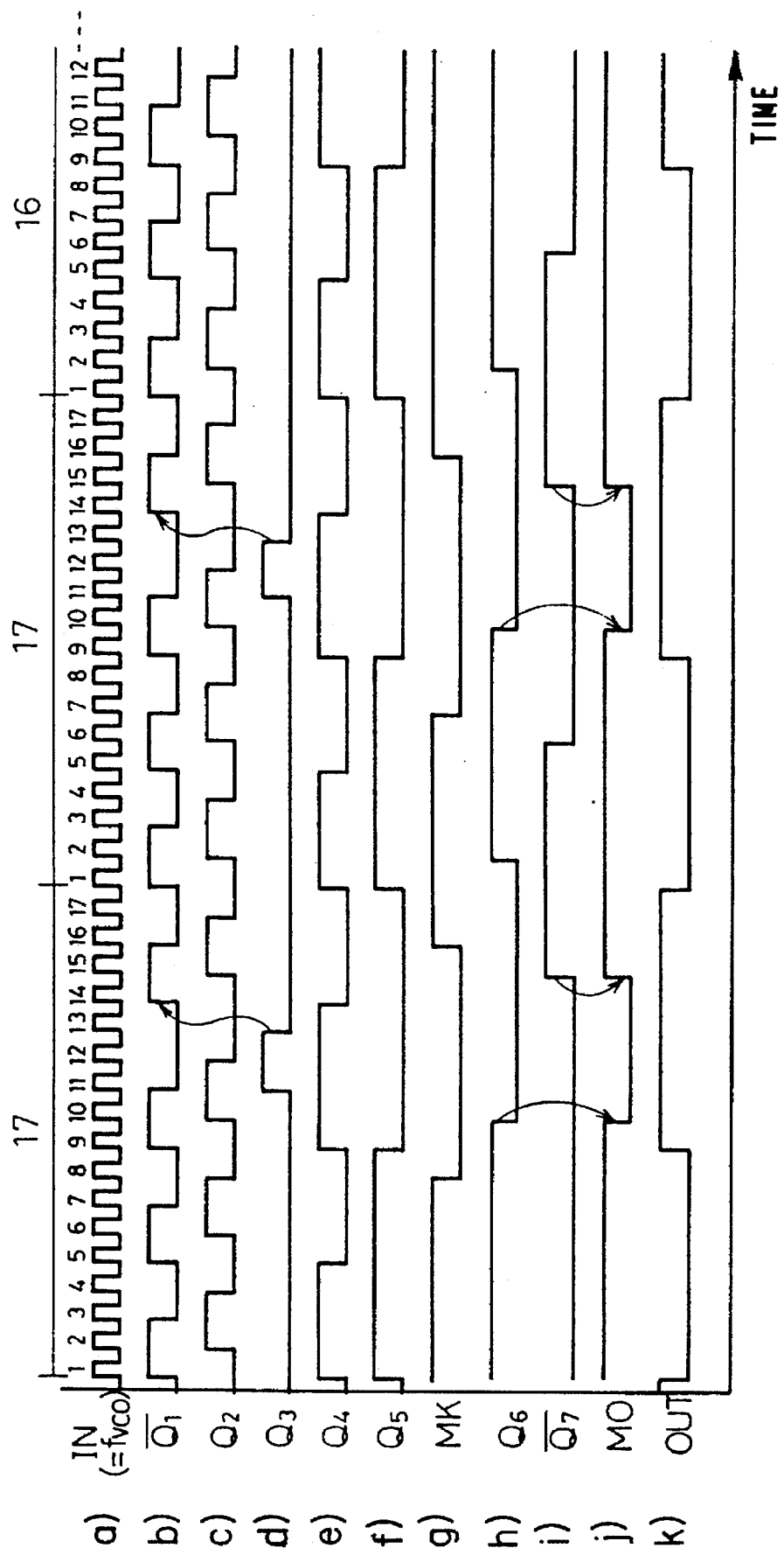
FIG. 6 is a diagram of waveforms for explaining the operation of the PLL circuit according to the present invention.
Figure 7:
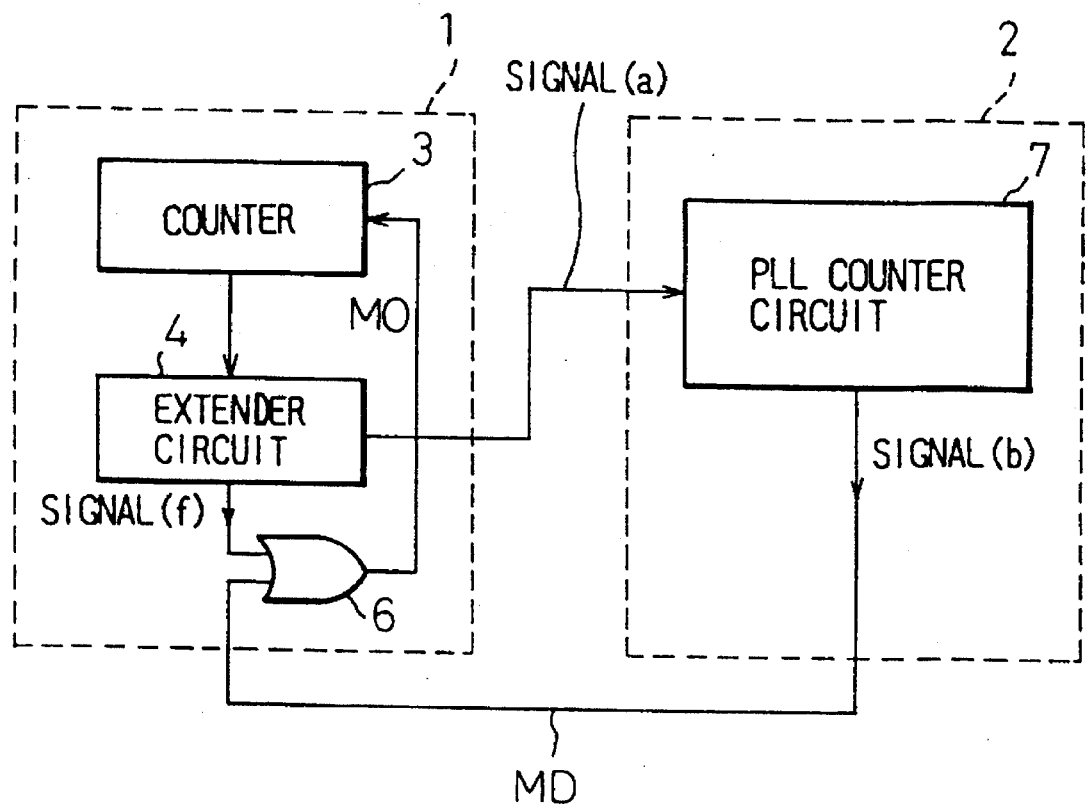
FIG. 7 is a block diagram which schematically illustrates the structure of a conventional PLL circuit.
Figure 8:
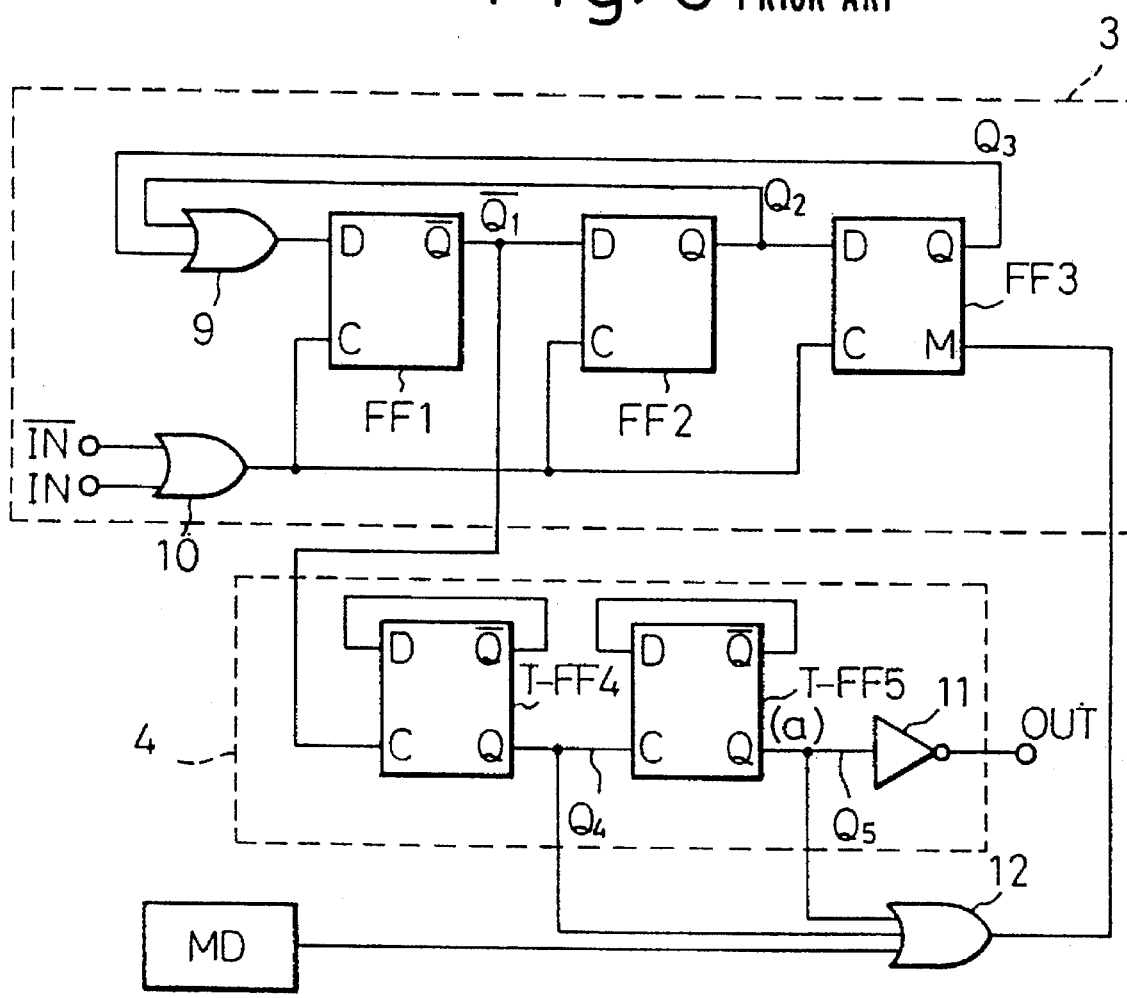
FIG. 8 is a block diagram illustrating the circuit structure in a prescaler in the conventional PLL circuit.

FIG. 6 is a timing chart explaining the operations at each of the constituent portions in the PLL circuit of the present invention. In the PLL circuit, the prescaler circuit unit 1 executes the module operation twice (i.e., twice of A-count) in the predetermined frequency-dividing operation and has a frequency-dividing ratio of 16. The module operation in which the frequency-dividing ratio is 17 is consecutively effected two times and the frequency-dividing operation in which the frequency-dividing ratio is 16 is effected at other times.

The operation depicted in FIG. 6 will be briefly described below. The module pulse generating signal MK is shifted by the flip-flops FF6 and FF7, using the output of the flip-flop FF2 as a clock signal, and an OR logic is obtained based on the Q-output of the flip-flop FF6 and the Q-bar output of the flip-flop FF7 in order to generate a pulse of "L" level of one period of the Q-output of the flip-flop FF2. The pulse of "L" level is then input as the module control signal MO to the reset terminal M of the flip-flop FF3 to release the flip-flop FF3 from the reset state and to carry out the module operation (+1 frequency-division) as described earlier.

This operation is effected a number of times equal to the A-count number (2 counts). The frequency-dividing ratio in this embodiment, therefore, is determined based on such a module operation as - - - , 16, 17, 17, 16, - - - .

Such a condition will now be described in detail with reference to the waveform diagram of FIG. 6.

Referring to the block diagram of FIG. 2(A), a pulse signal IN or IN-bar having an input frequency $f_{vco}$ is input to the input OR gate 10 of the counter 3, the Q-bar terminal of the flip-flop FF1 of the counter 3 outputs a signal Q1-bar which turns "H" and "L" after every two input pulse signals IN or IN-bar, and the Q-terminal of the flip-flop FF2 of the counter 3 outputs a pulse signal Q2 that turns "H" and "L" at a timing delayed by one pulse behind the Q-bar output signal of the flip-flop FF1.

The flip-flop FF3 of the counter 3, on the other hand, is usually maintained in the reset state. Therefore, the signal Q3 of "L" level is usually output from the Q-terminal of the flip-flop FF3 and is fed, via the OR gate 9, to the D-terminal of the flip-flop FF1 together with the signal Q2 from the Q-terminal of the flip-flop FF2.

The flip-flop FF3 is released from the reset state when the module control signal MO, output from the OR gate 15, is fed to the reset terminal M of the flip-flop FF3.

In the extender circuit 4, furthermore, the Q1-bar signal is input, from the Q-bar terminal of the flip-flop FF1 of counter 3, to the clock terminal C of the T-type flip-flop T-FF4 and the Q-output terminal outputs a pulse signal Q4 having a frequency twice the frequency of the Q1-bar signal. The Q4 signal is input to the clock terminal C of the neighboring T-type flip-flop T-FF5 and its Q-output terminal outputs a pulse signal ES having a frequency twice the frequency of the signal Q4. The pulse signal ES is input as an output OUT of the extender circuit 4 to the PLL COUNTER circuit 7 in the PLL circuit 2 via the inverter 11.

Therefore, the period of the signal OUT, which is output from the extender circuit 4, represents the period for dividing the frequency by 16 in the prescaler circuit 1.

In the PLL COUNTER circuit 7 under the above-mentioned condition, while an output signal, that represents the period of dividing the frequency by 16 and is output from the prescaler circuit unit 1, is being input to the PLL COUNTER circuit 7, a module pulse generating signal MK having "H" logic level is output from the module pulse signal generating circuit 8. However, the logic of the module pulse generating signal MK is inverted to an "L"-level signal within the period for dividing the frequency of the main counter in the prescaler, i.e., at a suitable moment while the frequency is being divided by 16 in this embodiment, or within a period of a frequency-dividing ratio determined in advance by the pulse swallow counter or at a moment when the A-count is initiated.

The period in which the logic of the module pulse generating signal MK is inverted to the "L" level is suitably determined.

The module pulse generating signal MK is subjected to the same logic level change during the next period for dividing the frequency by 16.

It can be said that the module pulse generating signal MK of "L" level corresponds to a module operation signal that instructs the execution of division of frequency by 17 in the PLL unit 7 in the pulse swallow counter.

The module pulse generating signal MK is input to the input terminal 16 of the module control circuit 5.

The signal Q6, output from the Q-output terminal of the flip-flop FF6 of the module control circuit 5, forms pulse signals of a period twice as great as the period of the signal Q2 in synchronism therewith which serves as a clock signal and is output from the Q-output terminal of the flip-flop FF2 in the counter 3, in order to successively shift the logic of the module pulse generating signal MK.

Furthermore, as in the flip-flop FF6, the signal Q7-bar output from the Q-bar terminal of the flip-flop FF7 of the module control circuit 5 forms pulse signals of a period twice that of the signal Q2 in synchronism therewith which serves as a clock signal and is output from the Q-terminal of the flip-flop FF2 but at a timing which is deviated by one period of the signal Q2 with respect to the output signal Q6, in order to successively shift the logic of the module pulse generating signal MK.

The output signal Q6 and the output signal Q7-bar are input to the OR gate 15, which outputs a module control signal MO having "L" logic level while the above two output signals both have "L" level.

That is, in the embodiment of the present invention, a point at which the logic level of the module pulse generating signal MK changes is not discriminated, but the logic level of the module pulse generating signal MK is shifted by using an internal clock signal in the prescaler to obtain a predetermined logic from the logic level of the signal during that period. Therefore, a delay in the module pulse generating signal MK or a deformation in the waveform does not have any relation.

The period of outputting a module control signal MO having the "L" logic level can be set anywhere in a period of the predetermined frequency-division of the prescaler. In this embodiment, however, this period is set from the rising point of a tenth pulse having the input frequency $f_{vco}$ to the rising point of a 15th pulse.

The module control signal MO of "L" level is input to the reset terminal M of the flip-flop FF3 so that it is released from the reset state.

Therefore, the output at the Q-terminal of the flip-flop FF3 assumes "H" level from the rising point of an 11th pulse having the input frequency $f_{vco}$ to the rising point of a 13th pulse. Accordingly, the Q-bar output of the flip-flop FF1 has an "L"-level period that is extended by one pulse of the input frequency, i.e., extended from the rising point of the 13th pulse of the input frequency to the rising point of a 14th pulse, so that the frequency division by 17 is carried out.

The above-mentioned operation is repeated in the next frequency dividing operation. Hence, the operation of frequency division by 17 is performed consecutively twice, and then, the operation of frequency division by 16 is repeated a predetermined number of times.

The PLL circuit according to the present invention is not at all affected by delays in the devices comprising the PLL circuit, and no erroneous operation develops. It is therefore allowed to set to a small value the frequency-dividing ratio of the prescaler itself, making it possible to realize a PLL circuit for a synthesizer that consumes small amounts of electric power and that is capable of executing high-speed tuning at reduced cost.

We claim:

1. A synthesizer of the pulse swallow-type prescaler system, comprising:

a PLL unit comprising:
   a PLL counter circuit which counts to a preset count value and then, responsive thereto, outputs a module operation switching signal, and
   a module pulse generating circuit responsive to the module operation switching signal output by the PLL counter circuit for outputting within a set period of time, as a module pulse generating output signal, a number of module pulses that corresponds to a number of module count operations executed within the preset count value; and a prescaler circuit comprising:
   a prescaler counter selectively responsive to a module count control signal input thereto for performing a selected one of first and second, different, module count operations, the first count operation using a selected frequency dividing ratio and the second count operation using a modified frequency dividing ratio determined in accordance with adding plus one to the selected frequency dividing ratio,
   an extender circuit, and
   a module control circuit which senses the logic state of the number of module pulses output by the module pulse generating circuit, obtains a predetermined logic from the logic level of the number of module pulses and the logic level of an internal clock signal, in synchronism with an internal clock signal output from one of the counter and the extender circuit, and in response thereto produces and supplies to the prescaler counter, as an output thereof, the module count control signal thereby to selectively control the prescaler counter to count in accordance with a corresponding, selected one of the first and second module counts.

2. A synthesizer according to claim 1, wherein:

said prescaler counter comprises a plurality of edge trigger type flip-flop circuits, an OR gate circuit and an input circuit; and one of said flip-flop circuits has a reset terminal to which the module count control signal, produced and output by said module control circuit, is applied.

3. A synthesizer according to claim 2, wherein:

said extender circuit comprises a plurality of stages of T-type flip-flop circuits; and said frequency-dividing ratio is determined by the number of stages of said T-type flip-flop circuits.

4. A synthesizer according to claim 3, wherein:

said T-type flip-flop circuits of said plurality thereof are serially connected to each other; and one of said T-type flip-flop circuits is controlled by a signal which is output from one of the plurality of edge trigger type flip-flop circuits of said prescaler counter.

5. A synthesizer according to claim 1, wherein:

said module control circuit comprises a plurality of edge trigger type flip-flop circuits, an OR gate circuit and an input terminal, said input terminal receiving said module pulse generating output signal from said module pulse signal generating circuit; and an output of said OR gate circuit is connected to a reset terminal of one of flip-flop circuits provided in said prescaler counter.

6. A synthesizer according to claim 1, wherein:

said module pulse generating circuit comprises an invertor and an OR gate having a pair of input terminals; and the module operation switching signal output of said PLL counter circuit is input to one of the pair of input terminals of said OR gate and an inverted signal comprising an output signal of said prescaler, inverted by said inverter, is input to the other of said pair of input terminals of said OR gate, an output terminal of said OR gate being connected to an input terminal of said prescaler circuit.

7. A synthesizer as claimed in claim 1, wherein the extender circuit further comprises a plurality of stages of T-type flip-flops, the number of the stages thereof determining the frequency-dividing ratio.

8. A synthesizer as claimed in claim 1, wherein the extender circuit produces an output which is supplied to the PLL counter circuit for driving same.

* * * * *